United States Patent [19]

Mitani et al.

[11] Patent Number: 5,692,914
[45] Date of Patent: Dec. 2, 1997

[54] PC CARD INCLUDING A JACK FOR A CONNECTOR

[75] Inventors: Hidenori Mitani; Shin-ichi Ishimoto, both of Tokyo, Japan

[73] Assignee: Mitsubishi Denki Kabushiki Kaisha, Tokyo, Japan

[21] Appl. No.: 579,520

[22] Filed: Dec. 27, 1995

[30] Foreign Application Priority Data

Jan. 24, 1995 [JP] Japan .................................. 7-009197

[51] Int. Cl.$^6$ .............................. H01R 13/44; H01R 13/72
[52] U.S. Cl. .......................... 439/131; 439/501; 439/946
[58] Field of Search ............................. 439/76.1, 501, 439/638, 676, 946, 131

[56] References Cited

U.S. PATENT DOCUMENTS

| 4,781,626 | 11/1988 | Lazarchik | 439/680 |
|---|---|---|---|
| 5,139,439 | 8/1992 | Shie | 439/638 |
| 5,338,210 | 8/1994 | Beckham et al. | 439/131 |
| 5,385,479 | 1/1995 | Okada | 439/142 |
| 5,391,094 | 2/1995 | Kakinoki et al. | 439/638 |
| 5,395,268 | 3/1995 | Okada | 439/676 |
| 5,411,405 | 5/1995 | McDaniels et al. | 439/131 |
| 5,457,601 | 10/1995 | Georgopulos et al. | 439/946 |
| 5,463,261 | 10/1995 | Skarda et al. | 439/55 |
| 5,481,607 | 1/1996 | Hsiao | 439/4 |
| 5,499,923 | 3/1996 | Archibald et al. | 439/946 |
| 5,505,633 | 4/1996 | Broadbent | 439/329 |
| 5,509,811 | 4/1996 | Homic | 439/55 |
| 5,537,293 | 7/1996 | Kobayashi et al. | 439/74 |
| 5,538,442 | 7/1996 | Okada | 439/946 |
| 5,547,401 | 8/1996 | Aldous et al. | 439/676 |
| 5,562,463 | 10/1996 | Tan | 439/76.1 |
| 5,562,472 | 10/1996 | Dubois et al. | 439/676 |
| 5,562,504 | 10/1996 | Moshayedi | 439/676 |
| 5,563,400 | 10/1996 | Le Roux | 439/75 |

*Primary Examiner*—Neil Abrams
*Attorney, Agent, or Firm*—Leydig, Voit & Mayer

[57] ABSTRACT

A PC card, for example, a modem card for a notebook computer, includes a card body having a recess accessible through an opening in an end surface of the card body. A jack for receiving an electrical connector is movable between a stored position within the recess inside the card body and a position extending out of the card body for connection to a plug. The jack may include a pair of jaws that spread apart when the jack extends outside of the card body and that approach each other when the jack is stored in the card body. The jack may include projections for engaging notches on a front surface of a standard plug and a pair of projections for grasping a wall separating indentations on a bottom surface of the standard plug.

5 Claims, 11 Drawing Sheets

PC CARD INCLUDING A JACK FOR A CONNECTOR

FIELD OF THE INVENTION

The present invention relates to a PC card having a plug or jack for making connection with terminal equipment which is standardized or conformable to a specific standard and used for communications over a telephone network.

BACKGROUND ART

In recent years, a plug for terminal equipment (hereinafter a plug) or a jack for terminal equipment (hereinafter a jack) has been employed in the connection of a telephone set, i.e., a terminal. The shape and structure of the plug or jack have been standardized.

FIG. 15 is a perspective view showing a plug. FIG. 16 is a perspective view showing the plug from behind. FIG. 17 is a front view showing a jack arranged in a room wall or the like. FIG. 18 shows a sectional view of the jack taken along section line 18—18 of FIG. 17.

A jack 5 as shown in FIG. 17 restricts the direction of insertion of a plug 2 to one direction, restrains the plug 2 from being pressed in the direction of insertion, stops movement in the direction of withdrawal, a direction opposite to the direction of insertion, and electrically couples to the plug 2.

The restriction of the direction of insertion of the plug 2 to one direction is realized by inner walls 5a of the jack 5. The restraint on pressure in the direction of insertion is realized by a bottom 5b. The ability to stop withdrawal is realized by stops 5c engaging a beam 7 of the plug 2. The electrical coupling is realized by electrodes 11 inside the jack 5.

FIG. 19 is a perspective view showing a PC card having a known jack. FIG. 20 is a schematic view showing a general-purpose connection cord having plugs at both ends. FIG. 21 shows a cord extending from a computer attached to a jack in a wall. FIG. 22 is a perspective view showing a PC card having a cord with a connector that has a plug independent of a card body.

In FIG. 19, a PC card 10, which includes a modem, is mountable in a slot of a personal computer or the like comprises a flat-plate card body 1 having a rectangular hole 1a in an end surface and a jack 3 stowed in the hole 1a so that it can be pulled out, like a drawer.

The jack 3 has a flat, plate shape and has a substantially rectangular hole 3a, into which the plug 2 is fitted, in a top main surface. The inner walls of the hole 3a restrict the direction of insertion of the plug 2. When the plug 2 abuts the bottom of the hole 3a, which is not shown, the tip of the plug 2 is stopped. Claws 3c engage with claws 7a on the sides of the beam 7 of the plug 2 and restrain the plug 2 from being withdrawn.

When the plug 2 is inserted into the jack 3, an electrode of the plug 2, which is not shown, comes into contact with an electrode 3b of the jack 3. Thus, the plug is electrically coupled with the jack 3. The electrode 3b is connected to an electronic circuit incorporated in the card body 1 by way of a cord 4.

When the PC card is put to use, the jack 3 is pulled out of the card body 1. The plug 2 is fitted into the jack 3 from above. The plug 2 is, as shown in FIG. 20, one of plugs 2 attached to an end of a general-purpose cord 8. The plug 2 at the other end of the cord 8 is, as shown in FIG. 21, inserted into a jack 5 in a wall or the like.

The known PC card 10 having the foregoing structure is mounted in a slot of a personal computer 6. When the PC card 10 is put to use, the jack 3 is pulled out. The PC card 10 is then plugged in the jack 5 in a wall or the like byway of the connection cord 8 and thus linked to a local telephone network.

FIG. 22 shows another prior art structure. A female connector 15a is on an end surface of a body 11 of a PC card 15. A connection cord 18 that is one to three meters long has a male connector 7a at one end for engaging the female connector 15a and a plug 2 at the other end.

The known PC card 15 is mounted in a slot of the personal computer 6 or the like. The plug 2 at the other end of the connection cord 18 attached to the back end of the PC card 15 is inserted into the jack 5 in a wall or the like, whereby the PC card 15 is linked to a local telephone network.

The described PC cards have certain drawbacks. As for the PC card 10 shown in FIG. 19, the plug 2 must be fitted into to the jack 3 from above. In other words, the plug 2 must be inserted perpendicular to the PC card 10. The cord 8a extends from the back end of the PC card 10. The cord 8a may interfere with a housing of the equipment to which the cord 8a is connected, such as a personal computer, or with another PC card that overhangs the slot. The plug 2 may therefore not be able to be fitted into the jack 3, and, depending on the type of personal computer, a housing may jut out beyond a slot in which a PC card is mounted or the slot may have an opening in a place recessed relative to the housing. As for a personal computer having a plurality of slots, a PC card extending beyond the opening of a slot may be mounted in one of the slots. As shown in FIG. 22, the PC card 15 requires the dedicated connection cord 18 that may be inconvenient in certain circumstances.

SUMMARY OF THE INVENTION

The present invention attempts to solve the foregoing problems. An object of the present invention is to provide a PC card having a coupling structure in which a cord extending from a plug coupled with a PC card lies in a direction so that the cord will not interfere with a housing of equipment such as a personal computer or another PC card. Another object of the present invention is to provide a PC card that does not require a dedicated connection cord and that is convenient to utilize.

In accordance with a first aspect, the present invention is directed to a PC card comprising a card body having a recess accessible at a hole in an end surface, a jack stowed in the recess so that it can be pulled out, and a cord stowed in the card body so that the jack can be pulled out, electrically coupling the jack to the card body. The jack is pulled out of the card body together with the cord. Being supported by the flexible cord, the jack can be oriented in any direction.

The jack is supported so that it can be moved between a stowed position in the card body and a jutting position jutting out of the card body. The PC card further comprises a rotating axle for supporting the jack so that the jack can rotate with respect to the card body at the jutting position. In other words, the jack is supported by the rotating axle so that it can rotate at the position at which the jack is jutting out of the body.

The PC card has a support arm, one end of which is pivotally secured to the card body and the other end of which supports the jack, so that the jack can be moved between a stowed position in the card body and a separated position at which the jack is outside the card body. When the jack is pulled out of the card body, the jack is supported by the support arm.

Alternatively, the jack may be supported so that it can be moved between a stowed position in the card body and a jutting position outside of the card body. The jack has upper and lower jaws that open for receiving a standard plug at the jutting position and that close for stowing the jack in the stowed position. The jack opens to enable insertion of the plug at the position at which the jack is jutting out of the body.

In accordance with a second aspect, the present invention is directed to a PC card. The PC card comprises a jack that receives a standard plug with positioning notches in a front surface and a wall at the back surface. The jack has projections that mate with the positioning notches and a holder for grasping the wall. Essentially, the jack mates with the positioning notches of the plug and holds the wall, immobilizing the plug. The jack is supported so that it can be moved between a stowed position in the card body and a jutting position outside of the card body. The jack is installed like a drawer in the card body.

In accordance with a third aspect, the present invention is directed to a PC card. The PC card comprises a card body and an extension unit that is attachable to an end of the card body, has a larger thickness than the card body, and stows a cord having a plug at the end. The cord is long enough to reach a jack in a wall and can be stowed in the extension unit.

In accordance with a fourth aspect, the present invention is directed to a PC card. The PC card comprises a card body that is thicker than an ordinary PC card and a cord that is stowed in the card body and has a plug at the end. The cord is long enough to reach a jack in a wall or the like. The jack receives a standard plug that has positioning notches in a front surface and a wall at the back surface. The jack is installed in the card body and has projections mating with the positioning notches and a holder for grasping the wall. Basically, the jack mates with the positioning notches and holds the wall, immobilizing the plug.

BRIEF DESCRIPTION OF THE DRAWINGS

FIG. 17 is a front view showing a jack for terminal equipment in a wall or the like;

DETAILED DESCRIPTION OF THE PREFERRED EMBODIMENTS

First Embodiment

Figure 1:
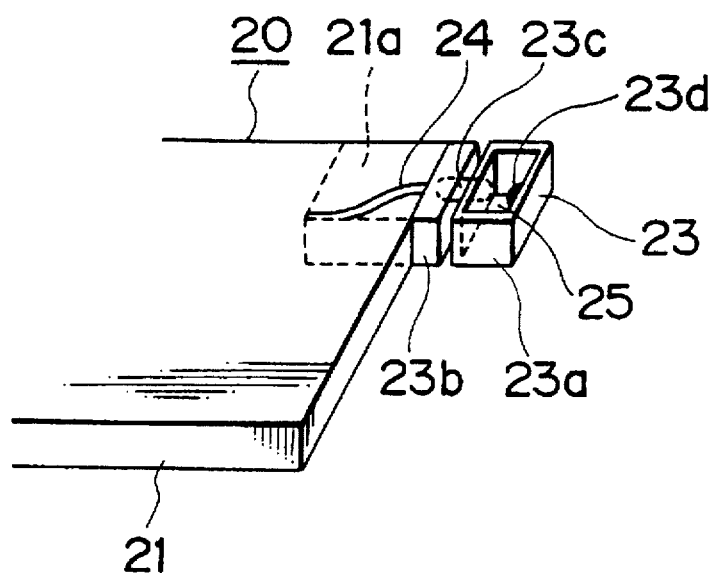
FIG. 1 is a perspective view showing a PC card according to one embodiment of the present invention.

FIG. 1 is a perspective view showing a PC card 20 in accordance with a first embodiment of the present invention. Part of a frame of a card body 21 having a substantially standard appearance is indented at a corner on a back end of the card opposite to the end of the card to be attached to an external unit, such as a personal computer. The indentation defines a recess 21a in cooperation with surface panels covering both main surfaces of the card body 21. A jack 23 has substantially the same height and width as the recess 21a but a smaller depth than the recess 21a. The jack 23 may be fitted into and stowed in the recess 21a.

The jack 23 is divided into a connector 23a and base 23b. The connector 23a has a substantially rectangular hole 25, into which a plug is fitted, in a top main surface. A structure for locking a plug in the hole 25 is identical to the prior art. The connector 23a is supported by a rotating axle 23c extending from the base 23b so that the connector 23a can rotate in a plane perpendicular to the main surfaces of the PC card 20. The base 23a is slightly wider toward the deepest end of the recess 21a. The recess 21a has a slightly narrower opening. At a jutting position at which the base 23a extends partly out of the recess 21a, the base 23a is tightly caught by the opening of the recess 21a and locked in the card body 21. A projection that is not shown is formed at the deepest end of the recess 21a. When the jack 23 is stowed in the recess 21a, the projection abuts the base 23a. Thereby, the jack 23 is stopped at a stowed position at which the head of the jack 23 is partly jutting out of the PC card.

The rotating axle 23 is hollow. A contact 23d is electrically connected to an electrical circuit, which is not shown, incorporated in the card body 21 by way of a cord 24 extending through the rotating axle 23. The cord 24 is a flexible cord. When the jack 23 is inserted in the recess 21a, the cord 24 is folded and stowed in a space behind the jack 23 that has been stopped and prevented from being further pushed into the PC card.

In the PC card having the described structure, since the jack 23 rotates 360°, a plug can be put into the jack 23 from any direction in the plane in which the jack 23 can rotate. A cord extending from a plug will therefore not interfere with a housing of equipment, such as a personal computer, or with another PC card. When the PC card is unused, the jack 23 can be stowed in the card body 23. The jack 23 can be retained and well protected.

Second Embodiment

Figure 2:
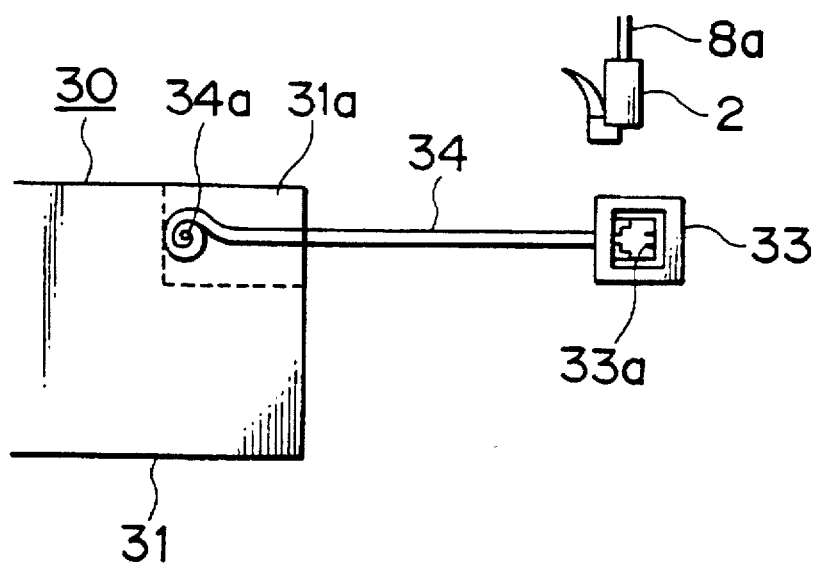
FIG. 2 is a plan view showing a PC card according to another embodiment of the present invention.

FIG. 2 is a plan view showing a PC card 30 in accordance with a second embodiment of the present invention. Part of a frame of a card body 31 having a substantially standard appearance is indented at a corner on a back end of the card that is opposite to the end of the card to be attached to an external unit, such as a personal computer. The indentation defines a recess 31a in cooperation with surface panels covering both main surfaces of the card body 31. A jack 33 has substantially the same height and width as the recess 31a but has a smaller depth than the recess 31a. The jack 33 may be fitted into and stowed in the recess 31a.

A projection that is not shown is located at the deepest end of the recess 31a. When the jack 33 is inserted in the recess 31a, the projection abuts the jack 33 and stops the jack 33 at a stowed position at which the head of the jack 33 juts slightly out of the PC card. A windable cord 34 is attached to the jack 33, thus electrically connecting a contact 33a in the jack 33 to an electrical circuit in the card body 31.

The cord 34 is wound about a takeup axle 34a in the deep end of the recess 31a. When the PC card is put to use, the cord 34 is pulled out. The length of the cord 34 is restricted to from several centimeters to ten centimeters because of the space in the deep end of the recess 31a. The takeup axle 34a includes a takeup mechanism that is not shown. The takeup mechanism comprises a spring attached to the takeup axle 34 for constraining the cord 34 to move in a direction in which the cord 34 is taken up, a ratchet wheel on the takeup axle, and a pawl that falls between teeth on the ratchet wheel. The components of the takeup mechanism are shown. The pawl falls between teeth on the ratchet wheel, thus stopping the takeup axle against the constraining force of the spring. However, the pawl permits rotation in a direction in which the cord 34 is pulled out. The cord is therefore locked and stopped after it is pulled out several centimeters. When the pawl that is not shown is separated from the ratchet wheel, the cord is unlocked. After being unlocked, the cord 34 is taken into the recess 31a.

In the PC card 30 having the described structure, the jack 33 can be pulled out of the card body 31 and put to use. Since the cord 34 is flexible and can be angled freely, the cord 8a extending from the plug 2 will not interfere with a housing of equipment, such as a personal computer, or with another card. When the PC card 30 is unused, the jack 33 can be stowed in the card body 31 together with the cord 34.

Third Embodiment

Figure 3:
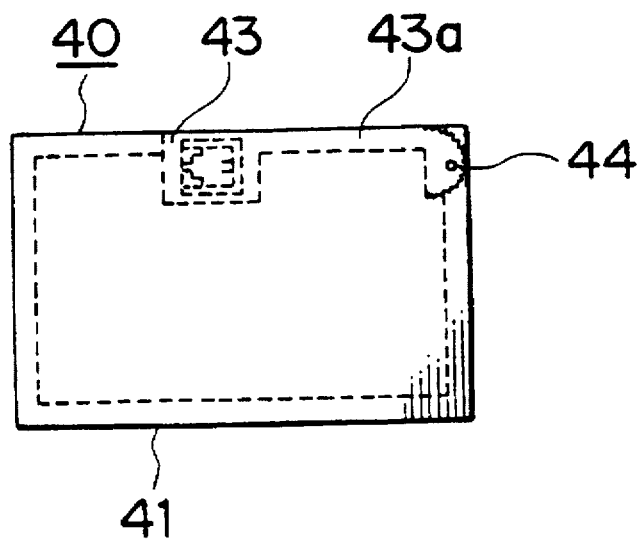
FIG. 3 is a plan view showing a PC card according to yet another embodiment of the present invention.
Figure 4:
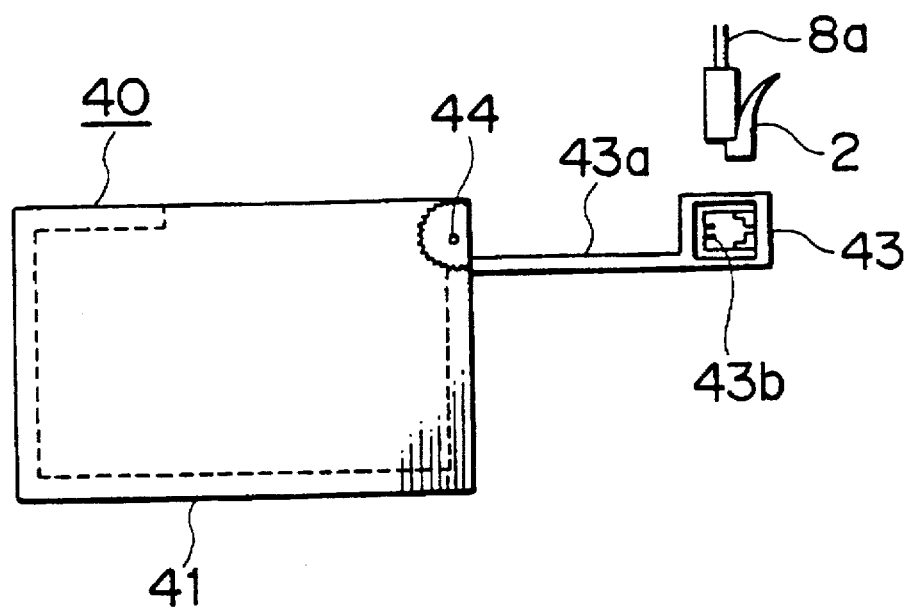
FIG. 4 shows a state in which a jack is pulled out of the PC card shown in FIG. 3.

FIG. 3 is a plan view showing a PC card 40 in accordance with another embodiment of the present invention. FIG. 4 shows the PC card 40 in a state in which a jack 43 is pulled out of the PC card 40. Part 43a of a frame of a card body 41 having a substantially standard appearance is separated from the remaining part of the frame. The part 43a of the frame is supported by an axle 44 located at an end of the card so that the part 43a can rotate, thus serving as a support arm 43a. A jack 43 is attached to the tip of the support arm 43a. The jack 43 and support arm 43a are stowed in the housing of the card body 41 when the card is unused. When the PC card 40 is put to use, the jack 43 is pulled out. The PC card 40 is then mounted in a slot of a personal computer or the like for use. A connection that is not shown is provided to electrically connect a contact 43b in the jack 43 to an electrical circuit in the card body 41.

In the PC card 40 having the described structure, when the jack 43 is pulled out of the card body 41 in order to put the PC card 40 to use, the jack 43 is supported by the support arm 43a at a position at which the jack 43 is separated from the card body 41. The cord 8a extending from the plug 2 will never interfere with a housing of equipment, such as a personal computer, or with another PC card. When the PC card is unused, the jack 43 can be stowed in the card body 41.

In this embodiment, the jack 43 and support arm 43a are located along the extension of one long side of the PC card 40. Alternatively, they may be located along the extension of one short side of the PC card. This structure makes it possible to pull out the jack 43 with the PC card 40 inserted in a personal computer.

Fourth Embodiment

Figure 5:
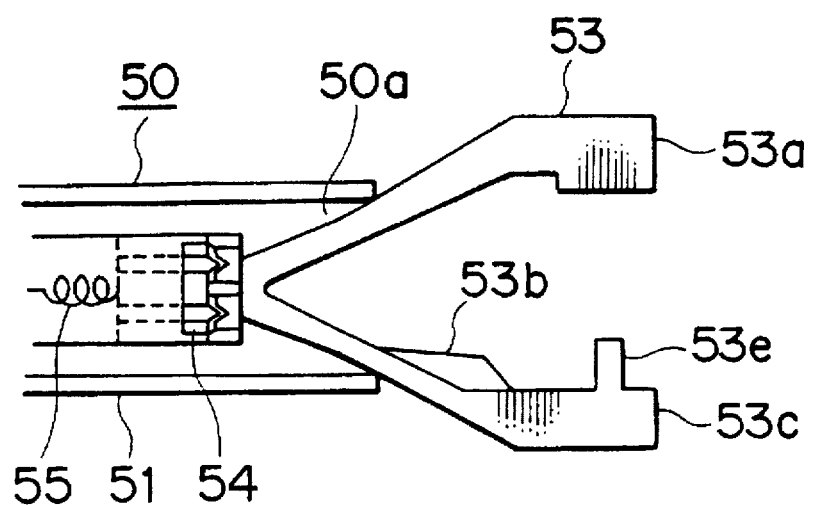
FIG. 5 is a side sectional view showing a PC card according to still another embodiment of the present invention.
Figure 6:
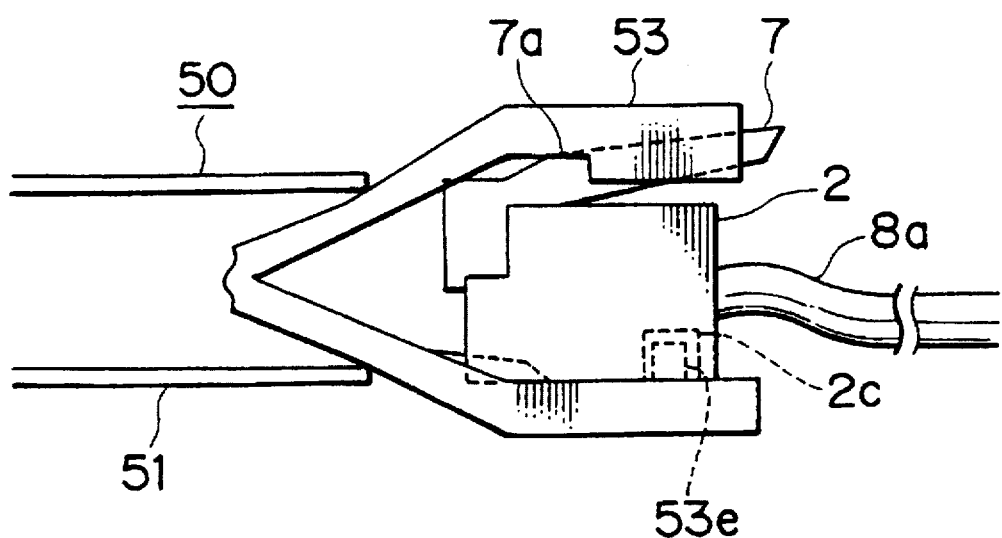
FIG. 6 shows a state in which a jack is pulled out of the PC card shown in FIG. 5 and a plug is fitted into the jack.
Figure 7:
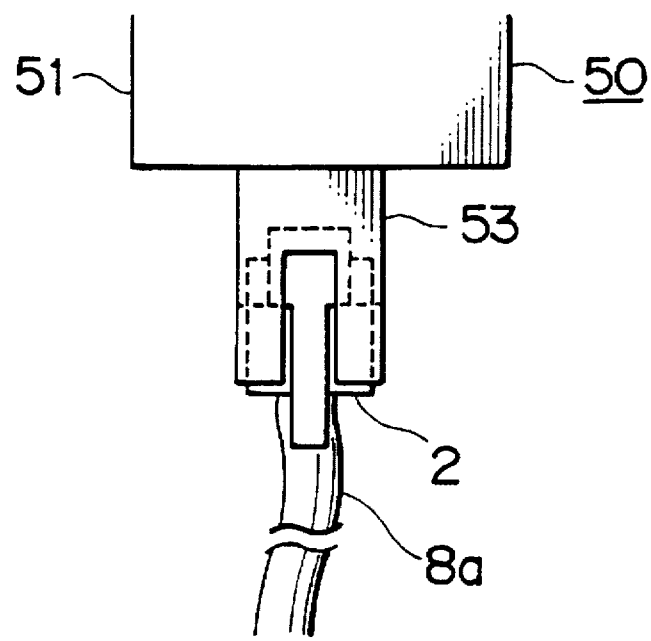
FIG. 7 is a top view of FIG. 6.
Figure 8:
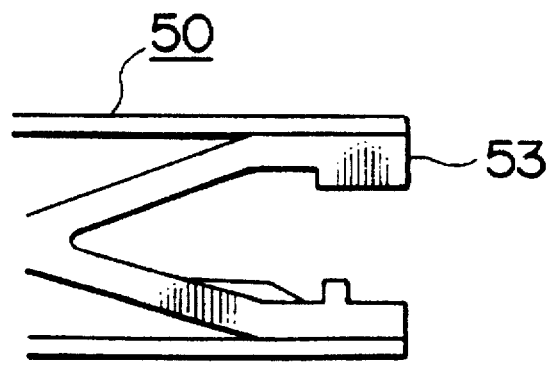
FIG. 8 shows a state in which the jack is stowed in the PC card shown in FIG. 5.

FIG. 5 is a side sectional view showing a PC card 50 in accordance with a fourth embodiment of the present invention. FIG. 6 shows the PC card 50 with a jack 53 pulled out of the PC card 50 shown in FIG. 5 and the plug 2 fitted into the jack 53. FIG. 7 is a top view of FIG. 6. FIG. 8 shows the PC card 50 with the jack 53 stowed in the PC card 50.

In FIG. 5, part of a back shorter side of the PC card 50 that is opposite to the side to be attached to a personal computer or the like is devoid of a frame and includes an opening 50a. A beak-like jack 53 is embedded in the opening 50a. The jack 53 comprises an upper jaw 53a and a lower jaw 53c, both jaws formed as flexible members. The upper jaw 53a engages with the claws 7a on the beam 7 of the plug 2. The lower jaw 53c abuts the back surface of the plug 2. A projection 53e on an inner surface of the lower jaw 53c is fitted into an indentation 2c in the back surface of the plug 2.

The jack 53 can extend from or retract into the card body 51. The jack 53 is constrained to move in a jutting direction by means of a spring 55 and restrained from moving by means of a lock mechanism 54 at the same time. The lock mechanism 54 is a known mechanism employed in, for example, a clicking-type ball-point pen. When clicked once, the jack 53 retracts. When clicked again, the jack 53 extends and remains in position.

In the PC card 50 having the described structure, when the PC card 50 is put to use, the jack 53 extends out of the card body 41. When the plug 2 is fitted into the jack 53, the plug 2 can be coupled with the card body 51 in the same plane as the card body 51. The cord 8a extending from the plug 2 will not interfere with a housing of equipment, such as a personal computer, or with another PC card. When the PC card 50 is unused, the jack 53 can be stowed in the card body 41.

Fifth Embodiment

Figure 9:
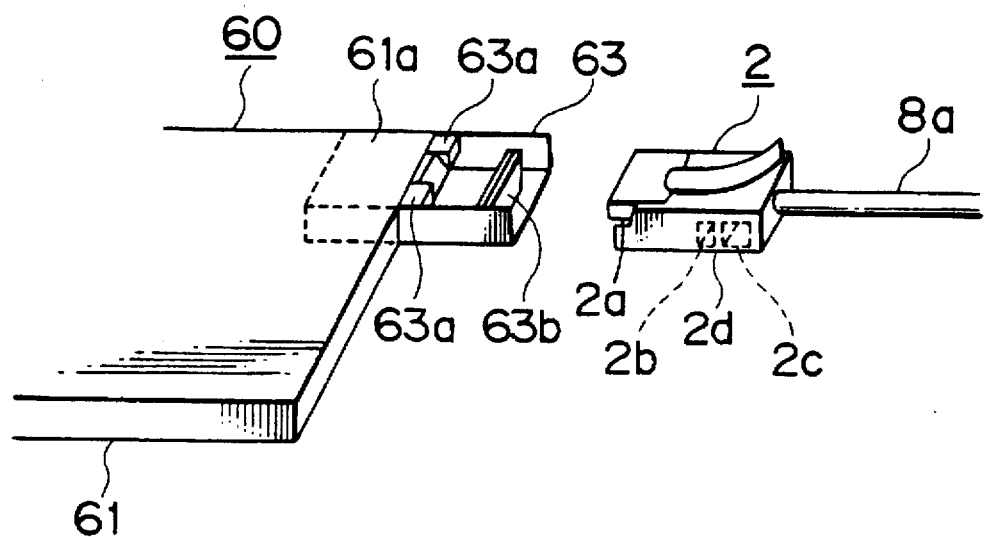
FIG. 9 is a perspective view showing a PC card according to another embodiment of the present invention.
Figure 10:
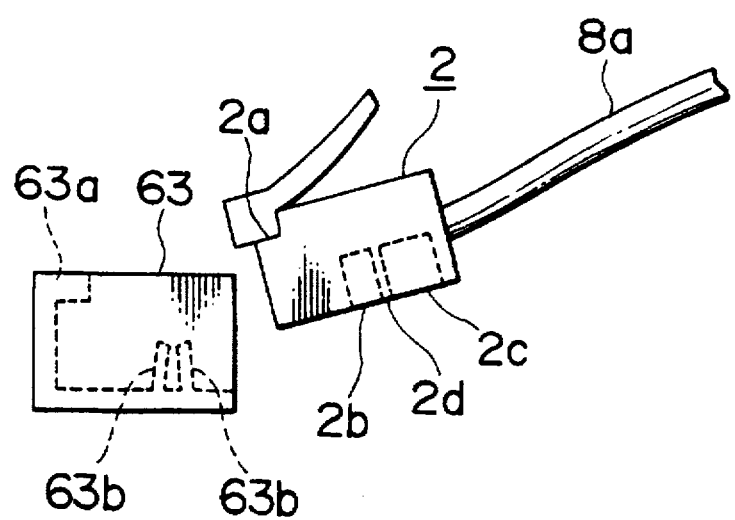
FIG. 10 is an enlarged side view showing the jack of FIG. 9.
Figure 11:
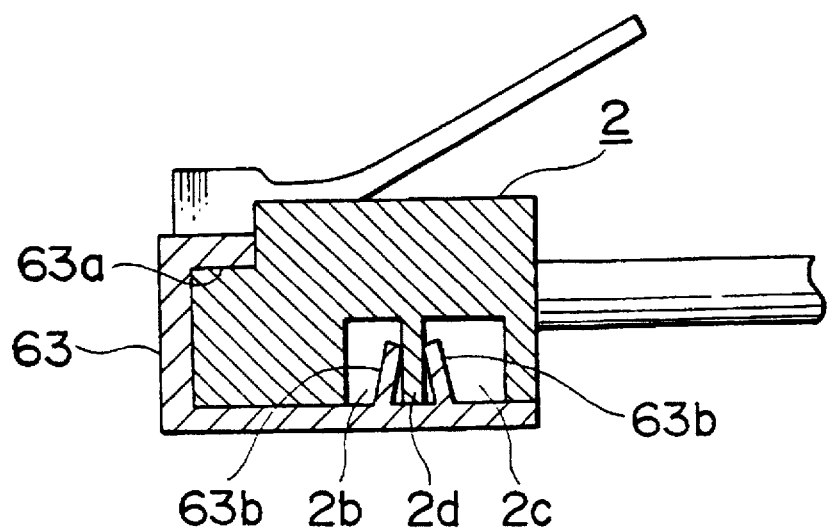
FIG. 11 shows a plug fitted into the jack of FIG. 9.

FIG. 9 is a perspective view showing a PC card 60 in accordance with a fifth embodiment of the present invention. FIG. 10 is an enlarged side view showing the jack 63 illustrated in FIG. 9. FIG. 11 is a sectional view showing a PC card with the plug 2 fitted into the jack 63 shown in FIG. 9. In this embodiment, the standard plug shown in FIGS. 15 and 16 is taken into consideration to realize the thin jack 63.

Figure 15:
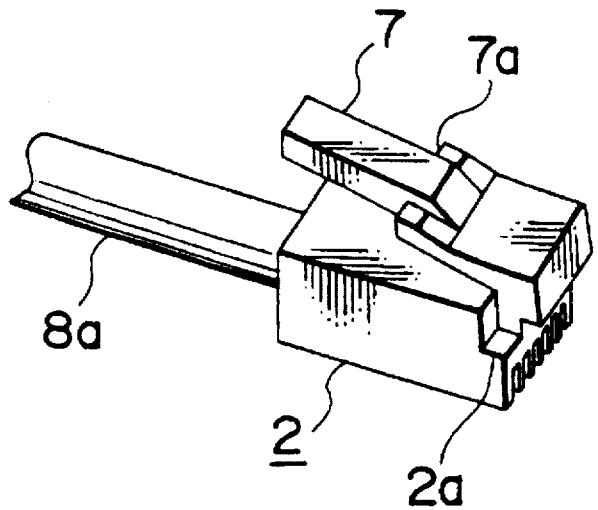
FIG. 15 is a perspective view showing a plug for terminal equipment.
Figure 16:
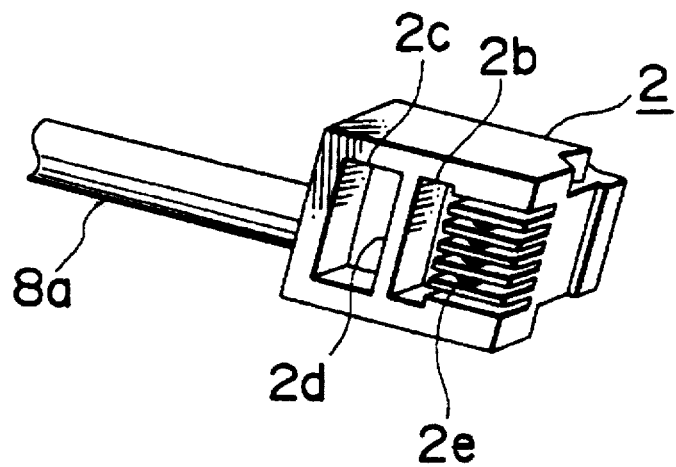
FIG. 16 is a perspective view showing the plug for terminal equipment from behind.
Figure 17:
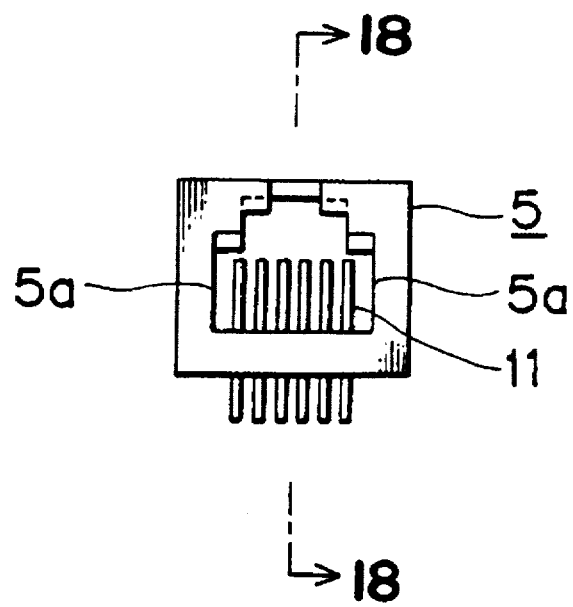
Figure 18:
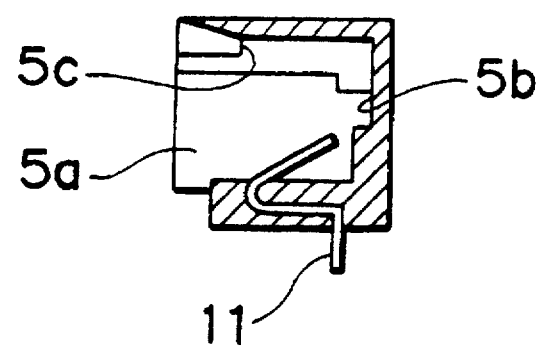
FIG. 18 shows a section taken along line 18—18 of FIG. 17.
Figure 19:
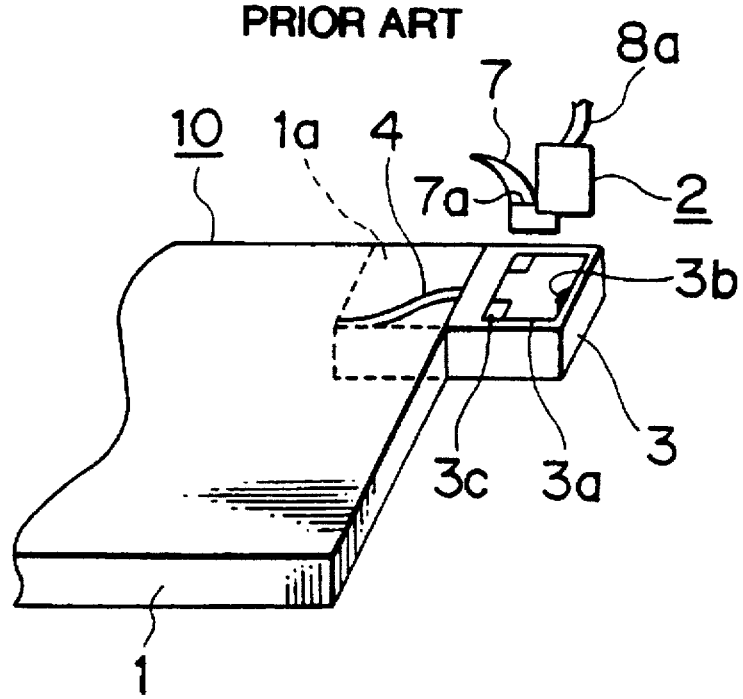
FIG. 19 is a perspective view showing a PC card having a known jack.
Figure 20:
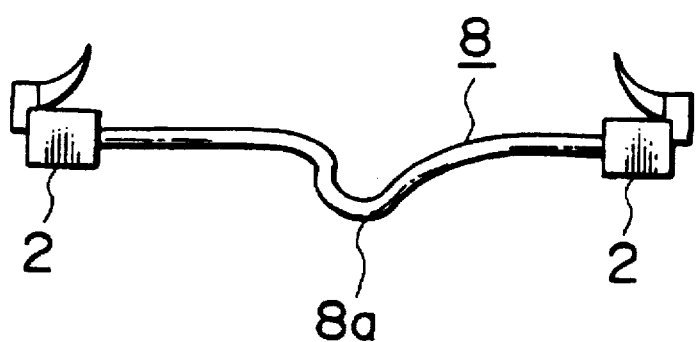
FIG. 20 is a schematic view showing a general-purpose connection cord having plugs at both ends.
Figure 21:
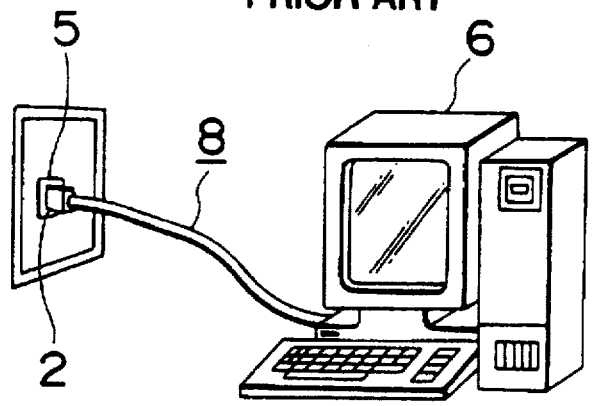
FIG. 21 shows a connection cord extending from a computer attached to a jack in a wall.
Figure 22:
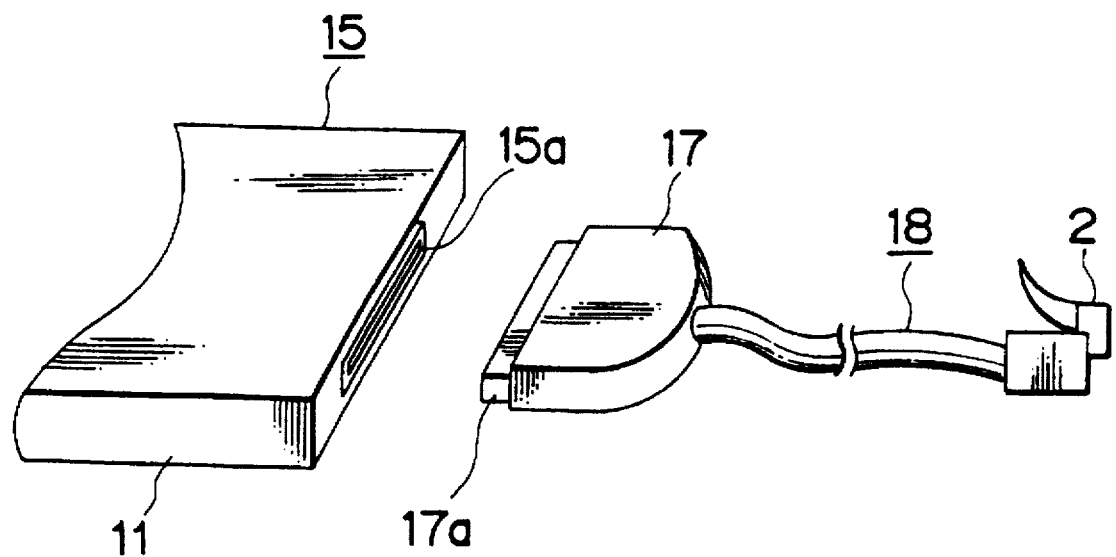
FIG. 22 is a perspective view showing another known PC card having a cord with a connection which has a plug independent of the card body.

FIGS. 15 and 16 show the standard plug. In FIG. 16, an indentation 2b is located behind a contact 2e on the back surface of the plug 2 in order to make the contact 2e convex relative to the other parts. A cord presser indentation 2c is located in the back part of the back surface. The cord presser indentation 2c is created in the course of press-fitting the cord 8a during molding of the plug 2. The indentation 2c behind the contact and the cord presser indentation 2b define a wall 2d.

In FIG. 9, part of a frame of a card body 61 having a substantially standard appearance comprises a rectangular indentation at a corner on a back side of the card that is opposite to the side of the card to be attached to an external unit, such as a personal computer. The indentation defines a recess 61a in cooperation with surface panels covering both main surfaces of the card body 61. A jack 63 has substantially the same height and width as the recess 61a and a smaller depth than the recess 61a. The jack 63 may be fitted into the recess 61a and stowed in the recess 61a.

The jack 63 is shaped substantially like a drawer. Projections 63a that mate with the positioning notches 2a of the plug 2 and a holder 63b including a pair of projections for holding between them the wall are located in the box-like jack 63. The projections 63a and holder 63b cooperate to immobilize the plug 2, whereby firm, releasable coupling is realized.

In the PC card 60 having this structure, coupling is realized by engaging the positioning notches 2a on the front surface of the plug 2 and the wall 2d, part of the back surface of the plug 2, by means of the projections 63a and holder 63b. The jack 63 can therefore be made thin and stowed like a drawer in the flat-plate PC card 60.

When the PC card 60 is put to use, the jack 63 is pulled out of the card body 61. The tip of the plug 2 is then inserted into the jack 63 from above. The positioning notches 2a are mated with the projections 63b. The back end of the plug 2 is then pushed down, and the wall 2d, as part of the back surface of the plug 2, is pressed into the holder 63b. Thus, the plug 2 is fitted into the jack 63. Because of the coupling, the plug 2 can be coupled with the PC card 60 in the same plane as the PC card 60. This causes the cord 8a to extend behind the PC card 60. The cord 8a will therefore not interfere with another PC card mounted in another slot or with a housing of equipment, such as a personal computer. When the PC card is unused, the jack 63 can be stowed in the card body 61.

Sixth Embodiment

Figure 12:
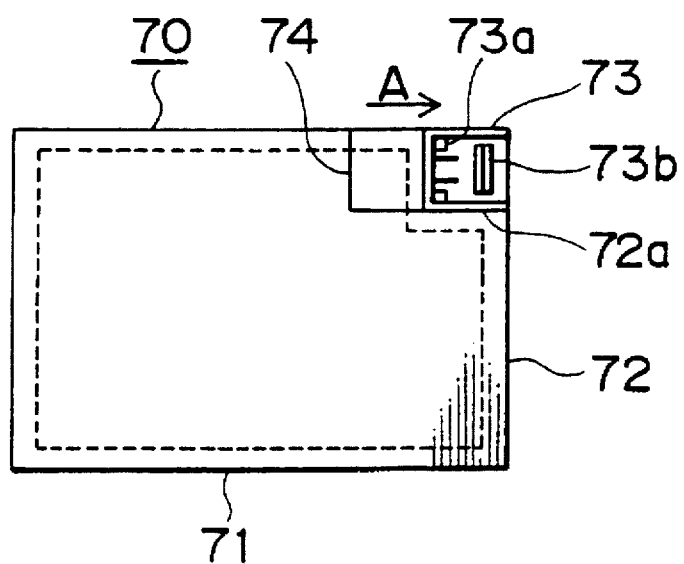
FIG. 12 is a front view showing a PC card according to yet another embodiment of the present invention.

FIG. 12 is a front view showing a PC card 70 in accordance with a sixth embodiment of the present invention. In FIG. 12, a frame 72 of a card body 71 having a substantially standard appearance has a rectangular indentation 72a at a corner on a side of the PC card 70 that is opposite to the side to be attached to an external unit. A jack 73 having substantially the same size as the indentation 72a is locked in the indentation 72a. The jack 73 has projections 73a that mate with the positioning notches 2a of the plug 2 and a holder 73b for holding the wall 2d. The projections 73a and holder 73b cooperate to couple the plug and jack. A cover 74 may slide in the direction of arrow A in order to cover the jack 73.

In the PC card 70 having the described structure, the cover 74 is opened to expose the jack 73. The tip of the plug 2 is inserted into the jack. The positioning notches 2a are then mated with the projections 73a, and then the back end of the plug 2 is pushed down. The wall 2d, as part of the back surface of the plug 2, is pressed into the holder 73b. Thus, the plug 2 is fitted into the jack 73. Because of the coupling, the plug 2 can be coupled with the flat-plate type PC card 70 in the same plane as the PC card 70. This causes the cord 8a to extend behind the PC card 70. The cord 8a will not interfere with another PC card mounted in another slot or with a housing of equipment, such as a personal computer. Since the jack 73 is locked in the frame 72, the jack 73 will not move and the coupling is hard to break because of its high strength. When the PC card is unused, the cover 74 may be closed to protect internal pins.

Seventh Embodiment

Figure 13:
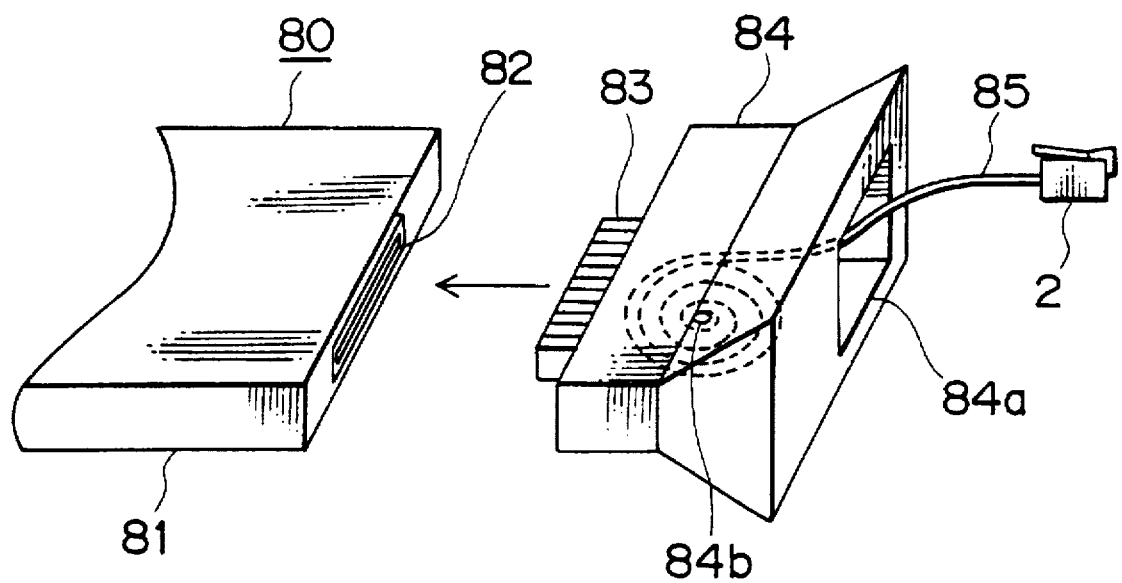
FIG. 13 is a perspective view showing a PC card according to still another embodiment of the present invention and an extension unit for the PC card.

FIG. 13 is a perspective view showing a PC card 80 in accordance with a seventh embodiment of the present invention and an extension unit used in combination with the PC card 80. In FIG. 13, a female connector 82 is located along an end of a body 81 of the PC card 80 that is opposite the end to be attached to an external unit. An extension unit 84 having a male connector 83 that may be mated with the female connector 82 is coupled with the female connector 82 and thus attached to the end of the PC card 80. The portion of the extension unit 84 that is opposite to the male connector 83 has an increasing thickness and a trapezoidal cross-section. A hole 84a for stowing the plug 2 is located in the end surface defined by the base of the trapezoidal cross-section. A cord 85 one to three meters long is wound in the extension unit 84. One end of the cord 85 comes out of the hole 84a and has the plug 2 at the tip.

A takeup axle 84b in the extension unit 84 has the same takeup mechanism as the one in the second embodiment. Every time the cord 85 is pulled out several centimeters, the takeup axle 84b is locked and stopped. After the takeup axle 84b is unlocked, the cord 85 is rewound in the extension unit 84.

In the PC card 80 having this structure, a long cord is stowed in the extension unit 84. The plug 2 attached to the tip of the cord 85 extending from the extension unit 84 is inserted into the jack 5 in a wall or the like, whereby the PC card 80 is linked to a local telephone network. Since an excessive length of cord 85 can be taken up, the cord 85 will not become a hindrance. When the PC card 80 is unused, all the length of the cord 85 as well as the plug 2 can be stowed in the extension unit 84. The plug 2 is pulled by a spring included in the takeup mechanism and retained in the hole 84a.

Eighth Embodiment

Figure 14:
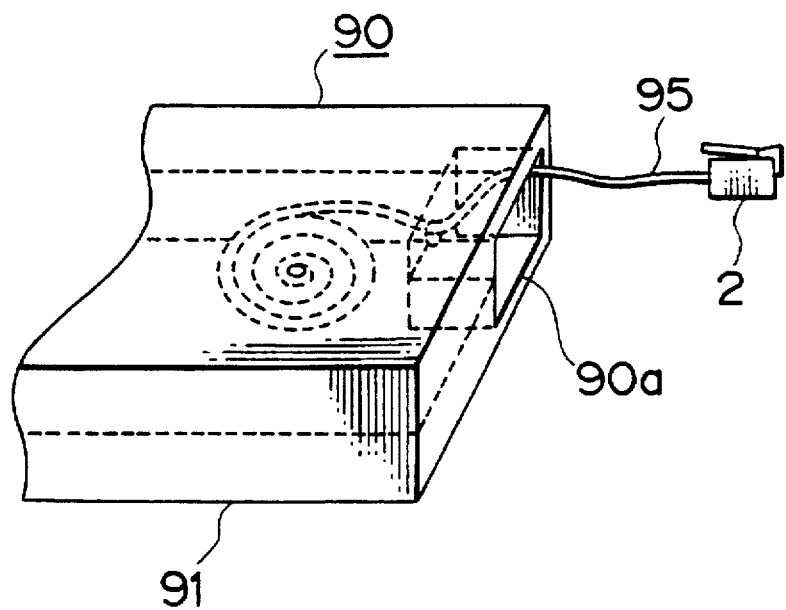
FIG. 14 is a perspective view showing a PC card according to another embodiment of the present invention.

FIG. 14 is a perspective view showing a PC card 90 in accordance with an eighth embodiment of the present invention. In FIG. 14, a body 91 of the PC card 90 is a type III characterized by a thickness that is twice as large as the thickness of an ordinary PC card of type II. A cord 95 is wound and stowed in the upper part of the thicker body 91. A hole 90a that is large enough to stow the plug 2 is located in the back end surface of the card body 91. One end of the cord 95 comes out of the hole 90a and has the plug 2 at the tip.

The PC card 90 having the described structure is mounted in a slot of the personal computer 6 for use. The cord 95 is pulled out of the back end of the PC card 90. The plug 2 attached to the tip of the cord 95 is inserted into the jack 5 in a wall or the like. Thus, the PC card 90 is linked to a local telephone network.

When the cord 95 is taken up, an excessive length of the cord 95 can be stowed. The cord 95 will therefore not become a hindrance. When the PC card 90 is unused, all the length of the cord as well as the plug 2 can be stowed. Other parts that have been separated are unnecessary. No dedicated connection cord is needed. An extension unit will not jut out of the end of the PC card.

A PC card in accordance with the first aspect of the present invention comprises a card body having a recess accessible through a hole in an end surface, a jack stowed in the recess that can be pulled out, and a cord stowed in the card body so that it can be pulled out and electrically connecting the jack to the card body. The jack is pulled out of the card body together with the cord. Being supported by the flexible cord the jack can be oriented in any direction. A plug can therefore be put into the jack from any direction.

The jack is supported so that it can be moved between a stowed position in a card body and a jutting position outside of the card body. A rotating axle is included for supporting the jack so that the jack can rotate with respect to the card body at the jutting position. The jack can rotate when the jack is jutting out of the card body. A plug can be put into the jack from any direction; that is, from above, below, left, right, or obliquely to the plane on which the jack can rotate. Consequently, a plug can be put into the jack from any position at which the plug will not interfere with a housing of external equipment with which the PC card is coupled.

The PC card includes a support arm, one end of which is pivotally secured to a card body and the other end of which supports a jack so that the jack can be moved between a stowed position in the card body and a separated position outside the card body. When pulled out of the card body, the jack is supported by the support arm at a position at which the jack is spaced from the card body. The plug can be inserted smoothly without any interference with a housing of external equipment or the like.

Alternatively, the jack is supported so that it can be moved between a stowed position in a card body and a jutting position outside of the card body. The jack is beak-like, having upper and lower jaws that open at the jutting position to enable insertion of a standard plug and that close in the stowed position in the recess. When the jack is jutting out of the card body, the jack opens for insertion of a plug. The plug can therefore be fitted into the jack so that a cord will extend behind the card body.

In accordance with a second aspect of the present invention, a PC card includes a jack enabling insertion of a standard plug that has positioning notches on the front surface and a wall as part of the back surface. The jack is installed in a card body and has projections that mate with the positioning notches and a holder for grasping the wall. The jack can therefore be made thin. Moreover, the plug can be fitted into the jack so that a cord will extend behind the PC card.

The jack is supported so that it can be moved between a stowed position in a card body and a jutting position outside of the card body and is installed like a drawer in the card body. The jack is thus well protected.

In accordance with a third aspect of the present invention, a PC card comprises a card body and an extension unit that is attached to an end of the card body, that has a larger thickness than the card body, and that stows a cord having a plug at the end. A cord that is long enough to reach a jack in a wall or the like can be stowed in the extension unit. The cord is pulled out of the extension unit, and the plug at the end of the cord is inserted into the jack in a wall. Another connection cord need not be procured.

In accordance with a fourth aspect of the present invention, a PC card comprises a card body having a larger thickness than an ordinary PC card and a cord stowed in the card body and having a plug at the end. A cord that is long enough to reach a jack in a wall or the like can be stowed in the card body. The cord is pulled out of the card body, and the plug attached to the end of the cord is inserted in the jack in a wall or the like. Another connection cord need not be procured.

The jack enables insertion of a standard plug that has positioning notches on the front surface and a wall as part of the back surface. The jack is installed in a card body and has projections that mate with the positioning notches and a holder for grasping the wall. The jack can therefore be small.

What is claimed is:

1. A PC card comprising:
   a card body having a recess and an end surface including an opening providing access to the recess; and
   a jack movable between a stowed position inside the card body and a jutting position extending outside the card body through the opening, the jack having an upper jaw and a lower jaw, the jaws comprising flexible members, the jaws being open in the jutting position for receiving a plug and closing upon movement from the open position to the stowed position within the recess.

2. The PC card according to claim 1, wherein the jack includes a base having projections on a front end for engaging positioning notches on a front surface of a plug and a holder including a pair of projections extending from the base for grasping a board of the plug, the board separating two indentations at a back surface of the plug.

3. The PC card according to claim 1 wherein the lower jaw includes a protrusion mateable with an indentation in the lower surface of the plug.

4. A PC card comprising:
   a card body having a recess and an end surface having an opening providing access to the recess; add
   a jack extending from the opening for connection with a plug including two positioning notches on a front surface and two indentations separated by a board at a lower surface, the jack having a base including projections proximate a front end for engaging the positioning notches when the plug is connected to the jack and a holder including a pair of projections extending from a back end of the base for grasping the board when the plug is connected to the jack.

5. The PC card according to claim 4, wherein the jack is movable between a stowed position inside the card body and a jutting position jutting out of the card body through the opening.

* * * * *

UNITED STATES PATENT AND TRADEMARK OFFICE
CERTIFICATE OF CORRECTION

PATENT NO. : 5,692,914
DATED : December 2, 1997
INVENTOR(S) : Mitani et al.

It is certified that error appears in the above-identified patent and that said Letters Patent is hereby corrected as shown below:

Column 10, Line 34, change "add" to --and--.

Signed and Sealed this

Twenty-third Day of June, 1998

Attest:

BRUCE LEHMAN

Attesting Officer     Commissioner of Patents and Trademarks